United States Patent
Kim

(10) Patent No.: US 8,865,488 B2
(45) Date of Patent: Oct. 21, 2014

(54) METHOD OF BONDING LIGHT EMITTING DIODE (LED) FOR LED MODULE AND LED MANUFACTURED THEREBY

(71) Applicant: Samsung Electronics Co., Ltd., Suwon-si (KR)

(72) Inventor: Han Hyoung Kim, Ansan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/798,007

(22) Filed: Mar. 12, 2013

(65) Prior Publication Data

US 2013/0240946 A1 Sep. 19, 2013

(30) Foreign Application Priority Data

Mar. 14, 2012 (KR) .................. 10-2012-0026238

(51) Int. Cl.
*H01L 33/48* (2010.01)
*H01L 33/64* (2010.01)

(52) U.S. Cl.
CPC .................................. *H01L 33/641* (2013.01)
USPC ........................................................ 438/26

(58) Field of Classification Search
USPC .................................. 257/79–99; 438/26–28
See application file for complete search history.

(56) References Cited

U.S. PATENT DOCUMENTS

| 7,824,937 B2 | 11/2010 | Suehiro et al. |
| 7,960,806 B2 | 6/2011 | Lee et al. |
| 2008/0102541 A1* | 5/2008 | Kang et al. ............... 438/15 |
| 2008/0315238 A1* | 12/2008 | Beckers et al. ........... 257/99 |

FOREIGN PATENT DOCUMENTS

| JP | 2008-085361 | 4/2008 |
| JP | 2009-260233 | 11/2009 |
| JP | 2010-287753 | 12/2010 |
| KR | 1020050116373 A | 12/2005 |
| KR | 1020090109987 A | 10/2009 |

* cited by examiner

*Primary Examiner* — Daniel Shook
(74) *Attorney, Agent, or Firm* — Renaissance IP Law Group LLP

(57) ABSTRACT

A method for bonding a light emitting diode (LED) for an LED module and a resulting LED structure are provided. The method may include preparing an LED comprising a first semiconductor layer, an active layer, and a second semiconductor layer on a substrate, applying a liquid on a mounting substrate which is oxidizable, and bonding a surface of the LED, on which a substrate is disposed, onto the mounting substrate during oxidation of the mounting substrate by the liquid. The resulting LED structure features substantially reduced thickness in a smaller overall package and one or more oxidized metallic layers exhibiting lower thermal insulation for better LED optical efficiency.

14 Claims, 7 Drawing Sheets

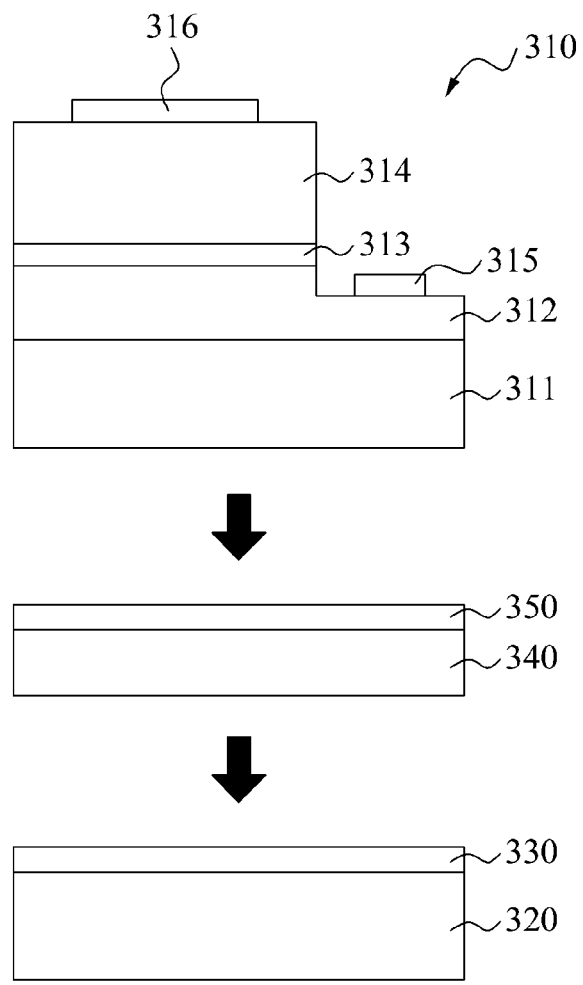

US 8,865,488 B2

METHOD OF BONDING LIGHT EMITTING DIODE (LED) FOR LED MODULE AND LED MANUFACTURED THEREBY

CROSS-REFERENCE TO RELATED APPLICATION

This application claims the benefit of Korean Patent Application No. 10-2012-0026238, filed on Mar. 14, 2012, in the Korean Intellectual Property Office, the disclosure of which is incorporated herein by reference.

BACKGROUND

1. Technical Field

The disclosure relates to a method for bonding a light emitting diode (LED) for an LED module, and more particularly, to a method for bonding an LED on a mounting substrate efficiently during manufacturing of an LED module.

2. Description of the Related Art

Light emitting diode (LED) packages have been used for signaling in the beginning. However, recently, the LED package is more widely used as a light source of a back-light unit (BLU) for a mobile phone or a liquid crystal display (LCD) for a wide display device, and for general lighting. Also, since an LED module using the LED consumes less power and has a longer life in comparison to bulbs or fluorescent lamps, demand for the LED module is gradually increasing.

In manufacturing of the LED module, a process of bonding an LED onto a mounting substrate, for example a printed circuit board (PCB), is indispensable. Generally, the LED is bonded onto the mounting substrate using a bonding agent made of an organic material such as resin. However, when resin is used to bond the LED, radiation efficiency may diminish since the resin has a relatively low thermal conductivity. Such a limit becomes more serious in a high-output LED module.

In addition, since resin is used in a thickness of about 1 to 30 micrometers (1 μm to 30 μm), the resin being disposed between the LED and the mounting substrate, the resin increases not only thermal resistance (and thus diminishes optical efficiency) but also increases the size of the LED module.

SUMMARY

An aspect of the present inventive concept provides a method of bonding a light emitting diode (LED), which facilitates bonding of the LED and increases radiation efficiency by bonding the LED on a mounting substrate using oxidation of a metallic material in manufacturing of an LED module.

According to an aspect of the disclosure, there is provided a method of bonding a light emitting diode (LED) for an LED module, the method including preparing an LED comprising a semiconductor layer and an active layer on an LED substrate, applying a liquid on a mounting substrate which is oxidizable, and bonding a surface of the LED substrate onto the mounting substrate during oxidation of the mounting substrate by the liquid. According to one embodiment of the disclosure, the preparing of the LED may include forming an oxidizable metal layer on the mounting substrate.

The method may further include disposing an oxidizable metal layer applied with the liquid between the LED and the mounting substrate, before the bonding of the surface of the LED onto the mounting substrate.

The bonding of the surface of the LED onto the mounting substrate may be simultaneously performed with disposing of the oxidizable metal layer applied with the liquid between the LED and the mounting substrate.

The oxidizable mounting substrate may include at least one metallic material selected from aluminum (Al), silicon (Si), titanium (Ti), chrome (Cr), zirconium (Zr), nickel (Ni), zinc (Zn), and stannum (Sn).

The oxidizable metal layer similarly may include at least one metallic material selected from Al, Si, Ti, Cr, Zr, Ni, Zn, and Sn.

The liquid may include a material including an oxygen (O) atom.

BRIEF DESCRIPTION OF THE DRAWINGS

These and/or other aspects, features, and advantages of the invention will become apparent and more readily appreciated from the following description of example embodiments, taken in conjunction with the accompanying drawings of which:

FIGS. 3A and 3B are schematic diagrams illustrating a method of bonding an LED, according to still another embodiment of the present disclosure.

DETAILED DESCRIPTION

Figure 1A:
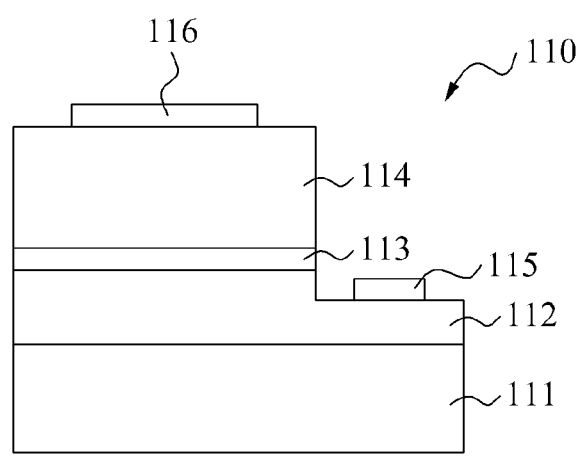
FIGS. 1A and 1B are schematic diagrams illustrating a method of bonding a light emitting diode (LED), according to an embodiment of the present disclosure.
Figure 1A:
Figure 1A:
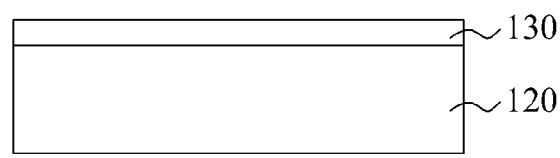

In the description of the present disclosure, detailed descriptions of related disclosed art or configuration determined unnecessarily to obscure the subject matter of the disclosure are omitted. Terms used below are defined based on their functions in the present inventive concept and may vary according to users, user's intentions, or practices. Therefore, the definitions of the terms should be determined based on the entire specification. In the drawings, like reference numerals refer to like elements throughout.

In the description of embodiments of the present disclosure, it will be understood that when an element is referred to as being "on" or "under" another element, it can be directly on another element or intervening elements may be present. A reference to "on" or "under" of each component will be described with reference to the drawings. In addition, the size and dimensions of components in the drawings may be exaggerated for explanation and do not entirely reflect an actual size.

Figure 1B:
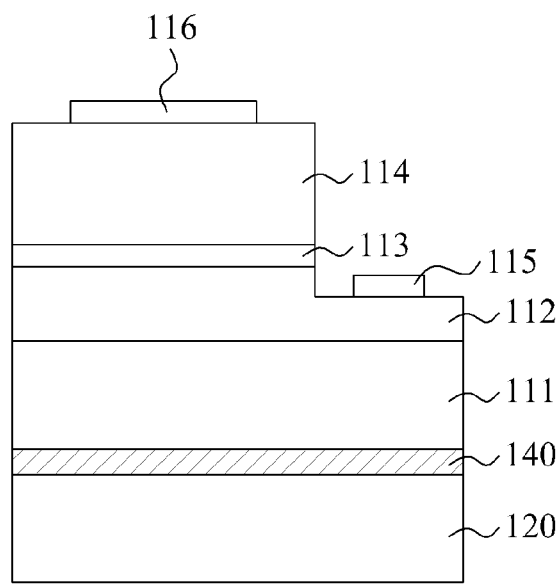

FIGS. 1A and 1B are schematic diagrams illustrating a method of bonding a light emitting diode (LED), according to an embodiment of the present disclosure. The method illustrated in FIGS. 1A and 1B relates to a technology for bonding an LED 110 on a mounting substrate 120 to manufacture an LED module.

Generally, an LED is manufactured in the form of a package as a unitary device. However, to apply the LED as the unitary device to a product, the LED needs to be bonded to a mounting substrate such as a printed circuit board (PCB). In this case, however, first bonding of the LED to a package substrate and second bonding of the LED to the mounting substrate are necessary, thereby increasing time and cost required for bonding. Furthermore, use of the package substrate increases the entire size of the LED module. To overcome such limits, a chip on board (COB)-type LED module has been developed.

In the COB-type LED module, the LED is mounted directly on the mounting substrate rather than on the package substrate. Therefore, radiation efficiency is highly influenced by a bonding material and method. Since a high-output LED module causes an extremely high temperature during operation, high radiation efficiency is required. When the radiation efficiency is not high enough, the LED module may be damaged by the high temperature, or the life of the LED module may be shortened. The LED bonding method illustrated in FIGS. 1A and 1B and 2A and 2B is suggested to overcome such limits.

Referring to FIG. 1A, the LED bonding method may include preparing an LED 110 in which a first semiconductor layer 112 for supplying electrons, a second semiconductor layer 114 for supplying holes and an active layer 113 for receiving the electrons and the holes, and emitting light in response to coupling between the electrons and the holes may be deposited on an LED substrate 111; applying a liquid 130 onto a mounting substrate 120 which is oxidizable; and bonding a surface of the LED 110 onto the mounting substrate 120 during oxidation of the mounting substrate 120 by the liquid 130. However, according to some embodiments of the present disclosure, LED layers may be arranged different from the above described embodiments depending on the application. For example, more or less semiconductor or active layers than the embodiment shown in FIG. 1 may be employed. Also, a reflective layer may be formed on the first and second semiconductor layers. In addition, a blocking layer or a transparent substrate may be formed between the first and second semiconductor layers 112, 114.

The LED 110 may further include a first electrode 115 disposed on the first semiconductor layer 112 and a second electrode 116 disposed on the second semiconductor layer 114. The first electrode 115 and the second electrode 116 may be horizontally disposed on the LED 110 in a parallel planar configuration, as shown. The substrate 111 of the LED 110 may be a sapphire ($Al_2O_3$) substrate, or a suitable alternative.

The mounting substrate 120 which is oxidizable may be made of a metallic material capable of being oxidized, e.g., by an oxygen (O) atom. In detail, the mounting substrate 120 may be made of at least one metallic material selected from aluminum (Al), silicon (Si), titanium (Ti), chrome (Cr), zirconium (Zr), nickel (Ni), zinc (Zn), and stannum (Sn). However, the disclosure is not limited to these metallic materials, and the mounting substrate 120 may include any other metallic material that is oxidizable.

The liquid 130 applied onto the mounting substrate 120 may be made of a material including an O atom. For example, the liquid 130 may be water ($H_2O$), but is not limited thereto.

When the liquid 130 is applied to the mounting substrate 120, the mounting substrate 120 may be oxidized by the O atom contained in the liquid 130. While the mounting substrate 120 is being oxidized by the liquid 130, the LED 110 may be bonded onto the mounting substrate 120. As shown in FIG. 1B, in the mounting substrate 120, a bonding layer 140 may be formed in a region oxidized by the liquid 130 to help bonding between the LED 110 and the mounting substrate 120. According to the LED module of the present embodiment, since the LED 110 and the mounting substrate 120 are bonded by oxidation of the metallic material rather than a thermally insulative bonding material such as resin, the manufacturing process may be simplified. Moreover, the LED's radiation efficiency may be improved.

In addition, the bonding layer 140 shown in FIG. 1B, which denotes the oxidized region, may have a thickness of about 0.01 μm to 0.03 μm. Compared to a conventional bonding method that uses resin, the thickness of the bonding layer 140 thus is considerably reduced, e.g. by two orders of magnitude. Therefore, thermal resistance and size of the LED module may be reduced.

Figure 2A:
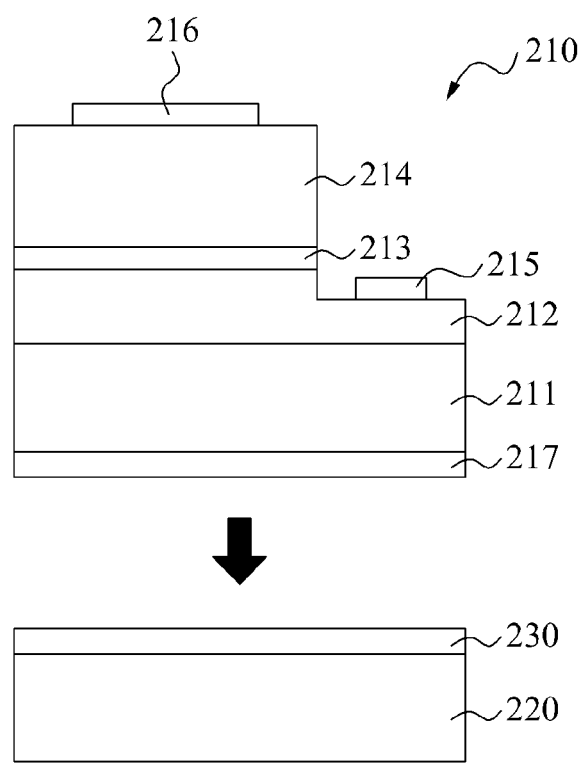
FIGS. 2A and 2B are schematic diagrams illustrating a method of bonding an LED, according to another embodiment of the present disclosure.
Figure 2B:
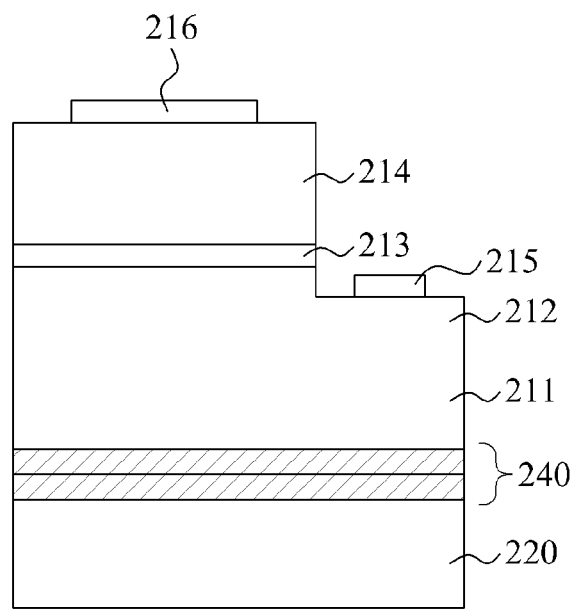

FIGS. 2A and 2B are diagrams illustrating a method of bonding an LED, according to another embodiment of the present disclosure.

Referring to FIG. 2A, the LED bonding method may include preparing an LED 210 in which a first semiconductor layer 212, an active layer 213, and a second semiconductor layer 214 are deposited on an LED substrate 211. The preparing may further include forming an oxidizable metal layer 217 on the LED substrate 211.

Additionally, the LED bonding method may further include applying a liquid 230 onto a mounting substrate 220 which is oxidizable, and bonding a surface of the LED 210 onto the mounting substrate 220 during oxidation of the mounting substrate 220 by the liquid 230.

The LED 210 may include a first electrode 215 and a second electrode 216 horizontally disposed in a parallel planar configuration, as shown.

The oxidizable metal layer 217 and the mounting substrate 220 being oxidizable may be made of at least one metallic material selected from Al, Si, Ti, Cr, Zr, Ni, Zn, and Sn. Besides the foregoing metallic materials, other metallic materials oxidizable by an O atom may be included in the mounting substrate 220.

The oxidizable metal layer 217 and the mounting substrate 220 being oxidizable may be made of the same or different material among the foregoing metallic materials and suitable others.

The liquid 230 applied onto the mounting substrate 220 may be made of a material including an O atom. For example, the liquid 230 may be $H_2O$, but is not limited thereto.

When the liquid 230 is applied to the mounting substrate 220, the mounting substrate 220 may be oxidized by the O atom contained in the liquid 230. While the mounting substrate 220 is being oxidized by the liquid 230, the LED 210 may be bonded onto the mounting substrate 220.

When the surface of the LED 210, on which the substrate 211 is disposed, is bonded to the mounting substrate 220, the liquid 230 also contacts the oxidizable metal layer 217 disposed on one surface of the substrate 211. Therefore, the oxidizable metal layer 217 is also oxidized by the O atom.

As shown in FIG. 2B, in the oxidizable metal layer 217 and the mounting substrate 220, a bonding layer 240 may be formed in regions oxidized by the liquid 230 to help bonding between the LED 210 and the mounting substrate 220, thereby to produce the LED module.

According to the LED module of the present embodiment, the bonding layer 240 is formed by the oxidizable metal layer 217 disposed on the LED 210 and also by the mounting substrate 220. As a result, bonding efficiency may be increased.

Figure 3B:
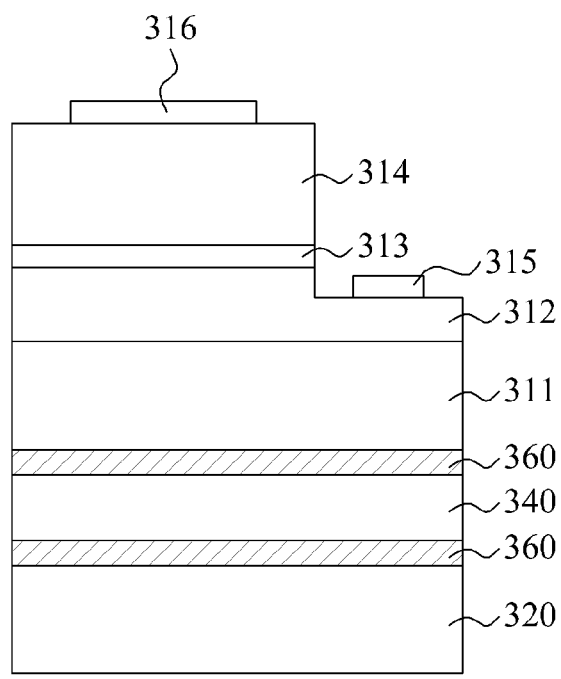

FIGS. 3A and 3B are diagrams illustrating a method of bonding an LED, according to still another embodiment of the present disclosure.

Referring to FIG. 3A, the LED bonding method may include preparing an LED 310 in which a first semiconductor layer 312, an active layer 313, and a second semiconductor layer 314 are deposited on an LED substrate 311; applying a liquid 330 onto a mounting substrate 320 which is oxidizable; and bonding a surface of the LED 310 to the mounting substrate 320 during oxidation of the mounting substrate 320 by the liquid 330. Especially, the method according to the present embodiment further includes disposing an oxidizable metal layer 340, to which a liquid 350 is applied, between the LED 310 and the mounting substrate 320 before the bonding of the LED 310 to the mounting substrate 320.

The liquid 350 including an O atom oxidizes the oxidizable metal layer 340. When the LED 310 is disposed on the oxidizable metal layer 340 during oxidation of the oxidizable metal layer 340, a bonding layer 360 is formed between the LED 310 and the oxidizable metal layer 340 as shown in FIG. 3B such that the LED 310 and the oxidizable metal layer 340 can be bonded to each other.

When the LED 310 and the oxidizable metal layer 340 being bonded to each other are bonded to the mounting substrate 320, the LED 310 is bonded to the mounting substrate 320 through a bonding layer 360 which is generated by oxidation of the mounting substrate 320 by, for example, the liquid 330.

In the embodiment shown in FIGS. 3A and 3B, while the LED 310 is being disposed on the mounting substrate 320, the oxidizable metal layer 340 to which the liquid 350 is applied may be disposed between the LED 310 and the mounting substrate 320, simultaneously. That is, oxidation of the oxidizable metal layer 340 and oxidation of the mounting substrate 320 may be performed simultaneously, thereby bonding the LED 310, the oxidizable metal layer 340, and the mounting substrate 320 simultaneously.

In the embodiment shown in FIGS. 3A and 3B, the mounting substrate 320 need not include an oxidizable metallic material. That is, although the mounting substrate 320 is not made of the oxidizable metallic material, since the oxidizable metal layer 340 is oxidized by the liquid 330 applied to the mounting substrate 320, the LED 310 nevertheless may be bonded to the mounting substrate 320 using an oxidized region of the metal layer 340. That is, bonding of the LED 310 to the mounting substrate 320 may be enabled by oxidizing both surfaces of the metal layer 340 at bonding layers 360 formed on either side thereof by the oxidation process.

In addition, although the metal layers or the mounting substrates of the respective embodiments have been explained to be oxidized by the liquids, the embodiments are not so limited. A gas that is capable of oxidizing metallic materials forming the metal layers or the mounting substrates because it includes O atoms, such as $O_2$, may be used to oxidize the metal layers and the mounting substrates.

Figure 4:
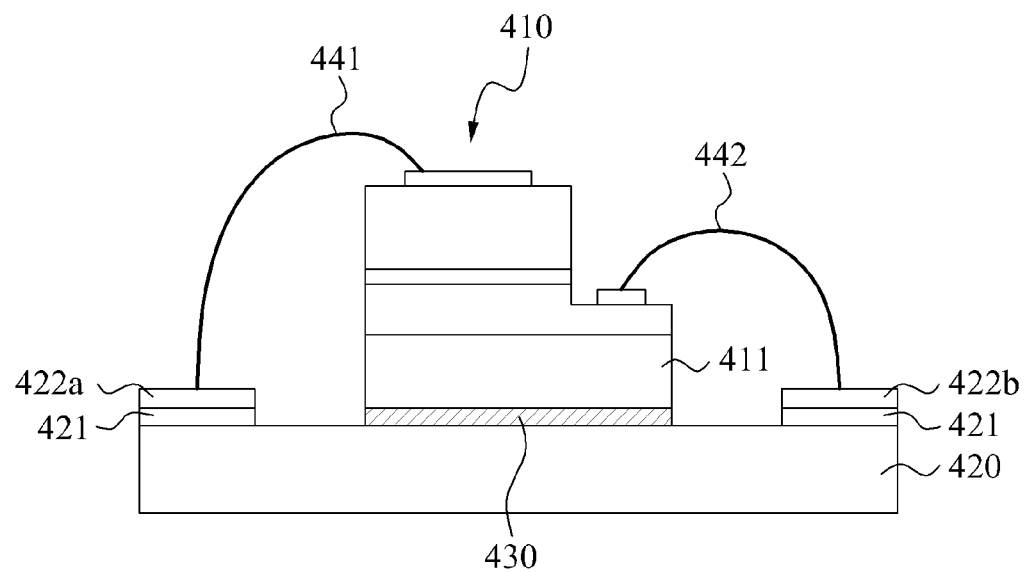
FIG. 4 is a schematic diagram illustrating an LED module according to an embodiment of the present disclosure.

FIG. 4 is a diagram illustrating an LED module according to an embodiment of the present disclosure.

Whereas FIGS. 1A and 1B show a structure of only a bonding area between the LED 110 and the mounting substrate 120, FIG. 4 shows an overall structure of the LED module.

Referring to FIG. 4, a mounting substrate 420 includes an insulating layer 421 disposed on one surface thereof, and a first electrode pad 422b and a second electrode pad 422a disposed on the insulating layer 421. The insulating layer 421 electrically insulates the mounting substrate 420 made of a metallic material from the first electrode pad 422b and the second electrode pad 422a.

The LED 410 may be bonded onto the mounting substrate 420 by the bonding method introduced with reference to FIGS. 1A and 1B. A substrate 411 included in the LED 410 may be bonded onto the mounting substrate 420 through a region of the mounting substrate 420 oxidized by a liquid, that is, a bonding layer 430.

A first electrode and a second electrode included in the LED 410 may be electrically connected with the first electrode pad 422b and the second electrode pad 422a through a first wire 442 and a second wire 441, respectively. Although not shown, a transparent lens mold or a phosphor mold may be further provided on the LED 410 as needed.

An LED bonding method according to the embodiments of the present disclosure may facilitate bonding of an LED onto a mounting substrate and increase radiation efficiency, by bonding the LED onto the mounting substrate using oxidation of metallic materials.

Furthermore, since an oxidized metal layer used for bonding between the LED and the mounting substrate has a thickness of about 0.01 μm to about 0.03 μm (at least two orders of magnitude less than is conventional), thermal resistance and size of the LED module may be reduced while its optical efficiency is increased.

Although a few exemplary embodiments of the present disclosure have been shown and described, the present disclosure is not limited to the described exemplary embodiments. Instead, it would be appreciated by those skilled in the art that changes may be made to these exemplary embodiments without departing from the principles and spirit of the invention, the scope of which is defined by the claims and their equivalents.

What is claimed is:

1. A method of bonding a light emitting diode (LED) for an LED module, the method comprising:
preparing an LED comprising a first semiconductor layer, an active layer, and a second semiconductor layer on an LED substrate;
applying a liquid on a mounting substrate which is oxidizable; and
bonding a surface of the LED substrate onto the mounting substrate during oxidation of the mounting substrate by the liquid.

2. The method of claim 1, wherein the preparing of the LED comprises:
forming an oxidizable metal layer on the LED substrate.

3. The method of claim 2, wherein the oxidizable metal layer comprises at least one metallic material selected from aluminum (Al), silicon (Si), titanium (Ti), chrome (Cr), zirconium (Zr), nickel (Ni), zinc (Zn), and stannum (Sn).

4. The method of claim 3, wherein the bonding of the LED substrate onto the mounting substrate is performed simultaneously with disposing of the oxidizable metal layer applied with the liquid between the LED and the mounting substrate.

5. The method of claim 1, further comprising:
disposing an oxidizable metal layer applied with the liquid between the LED and the mounting substrate, before the bonding of the LED substrate onto the mounting substrate.

6. The method of claim 5, wherein the oxidizable metal layer comprises at least one metallic material selected from aluminum (Al), silicon (Si), titanium (Ti), chrome (Cr), zirconium (Zr), nickel (Ni), zinc (Zn), and stannum (Sn).

7. The method of claim 5, wherein the liquid comprises a material including an oxygen (O) atom.

8. The method of claim 1, wherein the oxidizable mounting substrate comprises at least one metallic material selected from aluminum (Al), silicon (Si), titanium (Ti), chrome (Cr), zirconium (Zr), nickel (Ni), zinc (Zn), and stannum (Sn).

9. The method of claim 1, wherein the liquid comprises a material including an oxygen (O) atom.

10. A method of bonding a light emitting diode (LED) for an LED module, the method comprising:
preparing an LED comprising a first semiconductor layer, an active layer, and a second semiconductor layer on an LED substrate; and bonding a surface of the LED substrate onto a mounting substrate without the use of a resin or other bonding agent made of an organic material;

wherein the bonding comprises adding a liquid layer containing O between the LED substrate and the mounting substrate.

11. The method of claim 10, wherein the mounting substrate is metallic, and wherein the bonding is performed by oxidizing metallic materials within the metallic mounting substrate by exposure thereof to oxygen (O).

12. The method of claim 11, wherein the metallic materials comprise at least one metallic material selected from aluminum (Al), silicon (Si), titanium (Ti), chrome (Cr), zirconium (Zr), nickel (Ni), zinc (Zn), and stannum (Sn).

13. The method of claim 10, further comprising:
before the bonding,
disposing an oxidizable metallic layer between the LED substrate and the mounting substrate; and
applying a liquid on the surface of the oxidizable metallic layer and on the surface of the mounting substrate.

14. A method of bonding a light emitting diode (LED) for an LED module, the method comprising:
preparing an LED comprising a first semiconductor layer, an active layer, and a second semiconductor layer on an LED substrate;
bonding a surface of the LED substrate onto a mounting substrate without the use of a resin or other bonding agent made of an organic material;
before the bonding, forming an oxidizable metallic layer onto the LED substrate; and
applying a liquid between the surface of the LED substrate and the mounting substrate.

* * * * *